United States Patent [19]

Eidschun

[11] 4,186,062
[45] Jan. 29, 1980

[54] CONTINUOUS TAB PLATER AND METHOD

[75] Inventor: Charles D. Eidschun, Seminole, Fla.

[73] Assignee: Micro-Plate, Inc., St. Petersburg, Fla.

[21] Appl. No.: 923,939

[22] Filed: Jul. 13, 1978

[51] Int. Cl.² .................. C25D 5/02; C25D 17/06; C25D 17/28
[52] U.S. Cl. ............................ 204/15; 204/224 R
[58] Field of Search ......................... 204/15, 224 R

[56] References Cited

U.S. PATENT DOCUMENTS

| | | | |
|---|---|---|---|
| 3,274,092 | 9/1966 | Marantz | 204/224 R |
| 3,723,283 | 3/1973 | Johnson et al. | 204/224 R |
| 3,933,615 | 1/1976 | Levenson | 204/275 |
| 4,029,555 | 6/1977 | Tezuka | 204/206 |
| 4,029,564 | 6/1977 | Higuchi | 204/224 R |
| 4,093,520 | 6/1978 | Koontz | 204/224 R |

Primary Examiner—T. M. Tufariello
Attorney, Agent, or Firm—Jack E. Dominik

[57] ABSTRACT

A tab plater for purposes of stripping tin lead from contact tabs, and replating the same for further preservation and improved electrical contact with metal such as nickel and gold is shown having a plurality of processing stations. The printed circuit boards are passed through various stations where plating or stripping is undertaken and masked by means of the transport system comprising opposed resilient belts and means for sealingly engaging the printed circuit board at a line of demarcation. The printed circuit boards are passed over positioning stations to transfer from one location to another to insure precise positioning of the line of demarcation. The sparger fluid flow at the plating station is controlled by means of a venturi effect created by reversely flowing the fluid over a flow control section immediately adjacent and beneath the line of demarcation whereby selective depth control can be maintained with lower pressures of fluid thereby avoiding excess leakage at the ends of the printed circuit board where a gap exists before the belts form an impervious fluid barrier.

16 Claims, 24 Drawing Figures

CONTINUOUS TAB PLATER AND METHOD

FIELD OF INVENTION

The present invention is directed to plating in the printed circuit board industry, and more specifically to processing by means of stripping tin lead from a partially prepared printed circuit board, replating the same primarily with nickel followed by gold, and thereafter reflowing to desirably diffuse the gold into the solder. The general subject matter of plating printed circuit boards is disclosed in my earlier U.S. Pat. Nos. 4,036,705 and 4,064,019.

SUMMARY OF THE PRIOR ART

In the industry the general steps for etching, nickel plating, and gold plating as well as intermediate washing and drying steps are known in broad concept. A hard printed circuit board can vary in thickness from 1/32 of an inch to ⅛ of an inch. The boards are fairly rigid, and normally cut to a rectangular shape. They are characterized by having connectors on one edge of the board which normally require nickel and gold plating. Most printed circuit boards are covered with tin lead which must first be removed selectively, then nickel is applied in thicknesses ranging from 0.00005 through 0.0005, and gold thicknesses ranging from 0.00003 through 0.0002. Standards for gold plating of printed circuit board tabs are such that under no condition may solder strip, nickel plating, or gold plating serve as a contaminant above a line of demarcation which is known as the "mask-line." If any plating is deposited or tin lead removed above this mask-line, a board may be rejected. Thus it is critical to completely seal the circuit board from the line of demarcation in a direction away from the circuit board tabs. It is also necessary to plate the edge board connectors or tabs and provide acceptable thicknesses distributed along the length of the tab as well as along the length of the panel from side to side. Distribution standards normally run plus or minus 10% of the nominal thickness. Primarily the line of demarcation is formed in most plating operations by means of a masking tape. Of necessity, accuracies are limited, and the masking tape itself introduces contaminants on the face of the printed circuit board, as well as a significant expense in thousands of yards of masking tape which can only be used once.

Attempts have been made to use opposed belts to pass printed circuit boards through various processing stations. This gives rise to a problem, however, because the belts when compressed to serve as a mask still have a gap at each end where the printed circuit board terminates and when the belt cannot bend sufficiently to conform to a sharp corner. With high pressure fluids and high velocities such as are necessary for this type of plating, leaks can occur at the gap and the solutions will contaminate the balance of the printed circuit board. Thus it becomes important to minimize the likelihood of leakage, and maximize the effect of the seal when using a belt transport mechanism. Furthermore, plating at the junction between the gold and tin lead to permit gold diffusion when reflow is undertaken requires that the plating thickness at the upper portion of the tab be controlled with a high degree of precision, and usually that it be a fraction of the overall gold plating thickness.

SUMMARY

The present invention including the apparatus for plating, the method, and indeed, the product, stem from the discovery that the belts in transport be positioned in a guide, and the lower portion of the guide have a flow control device tooled to a geometry which will allow smooth solution flow across its surface and direct the majority of the solution in a downward direction away from the belt. By forcing the fluid through this trajectory, a modified venturi effect is created over the surface of the board immediately beneath the belt. This effect causes the equivalent of a suction to form at the belt surface and around the edge of the board which prevents the solution from pumping up the edge of the board and wetting surfaces which were undesirable. The curved surface also, when thicker deposits are required at the line of demarcation or the junction between the belt and the plated area, may be provided with slots to allow anode exposure and additional fluid to be directed at the plating area. In furtherance of the precise positioning of the line of demarcation, positioning stations which transfer the printed circuit board from one processing location to another include a rolling contact on the base of the printed circuit board and yieldable rolling contact on top of the printed circuit board. Further adjustment providing a perfect parallelism between the opposed belts is provided on a masterbelt for raising and lowering the same as it passes around the drive wheel. The product produced due to the processing and mechanism permits an acceptable diffusion of the gold into the tin lead solder upon reflow. This results from a reduced gold thickness providing a functional points between gold and tin lead during reflow and distinguishes the product from printed circuit boards heretofore manufactured.

In view of the foregoing, it is a principal object of the present invention to provide a method for the gold plating of tabs on a printed circuit board in which the thickness and line of demarcation of the gold at the tin lead or solder junction is controlled with a high degree of precision.

Another object of the present invention is to provide a printed circuit board in which the gold plating on the connector tabs is controlled to very close tolerances, and a thin portion of the gold plating remains prior to reflow of a dimension less than ten-millionths of an inch to the end that gold solder diffusion can be developed in good electrical contact with the underlying copper circuit.

Still another object of the present invention looks to a method for providing a machine for processing printed circuit boards achieving the foregoing objects and in which leakage of fluid at the ends of the printed circuit board while being transported between compressed belts is avoided by means of providing a reduced pressure area immediately beneath the belt guide.

Still another object of the present invention is to provide a sequence for the processing of printed circuit boards in which dimensional registration is held within precise tolerances while the same are processed automatically from a loading station to an unloading station without interruption by manual contact during the process.

DESCRIPTION OF DRAWINGS

Further objects and advantages of the present invention will become apparent as the following description proceeds, taken in conjunction with the accompanying illustrative drawings in which:

FIGS. 5 through 20 inclusive are diagrammatic representations of the formation of a contact tab, with FIGS. 5 through 12 illustrating the product having diffusion between the gold and the tin lead solder alloy. FIGS. 13 through 20 represent other junctions which can be achieved.

DESCRIPTION OF THE PREFERRED EMBODIMENT

Figures 1, 4, 24:
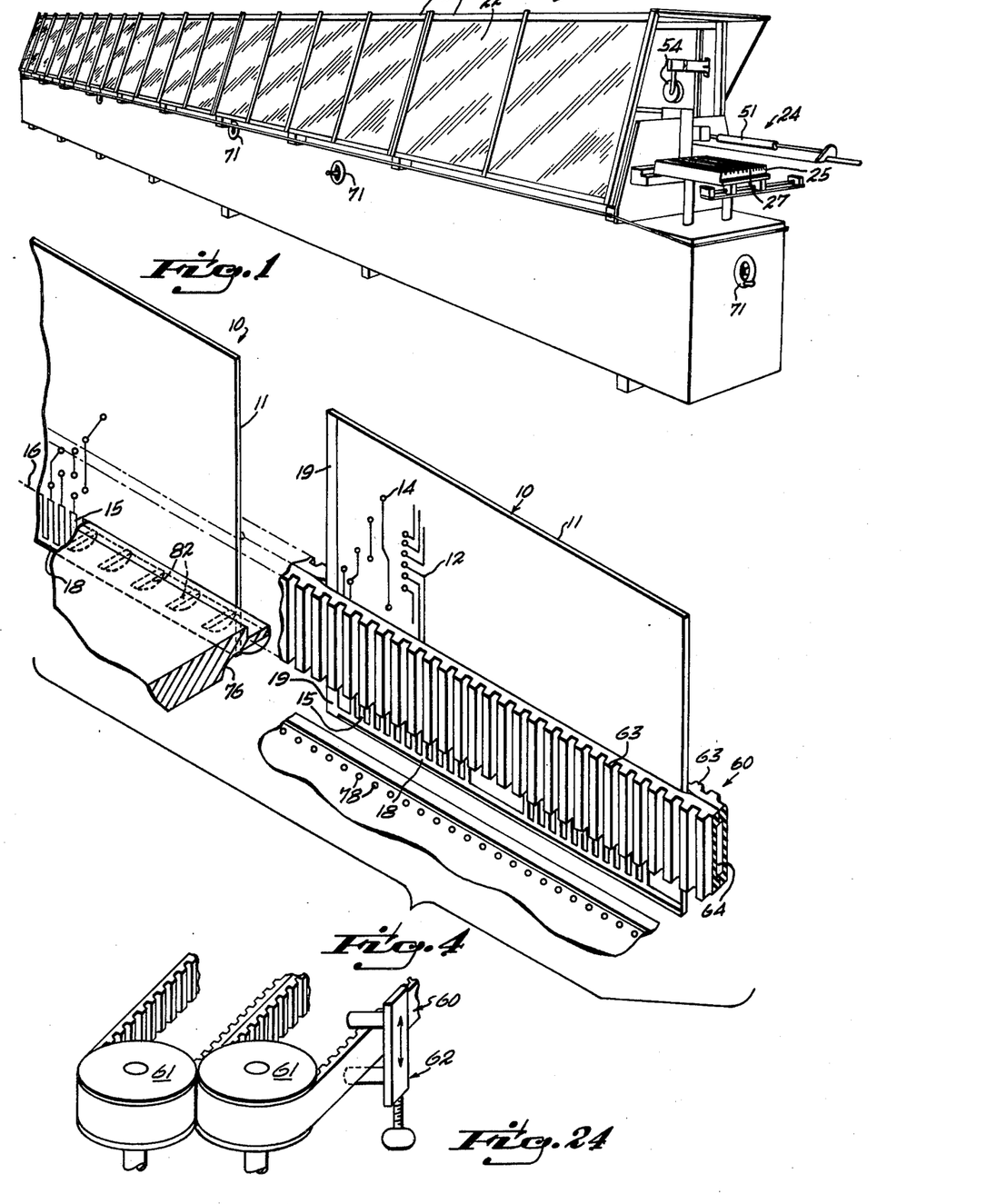
FIG. 1 is a perspective view of the plating machine taken from the load station.
FIG. 4 is an exploded perspective view showing a printed circuit board in transparent engagement through a plating station.
FIG. 24 is a partially diagrammatic top view and front of the belt transport assembly illustrating the relationship between the belts and their respective drive sprockets, and showing the belt alignment mechanism.

As shown in the drawings, particularly is exploded perspective FIG. 4, the printed circuit board 10 is provided with a backing 11 to which a plurality of leads 12 are secured. Component holes 14 are at random locations and are used for the subsequent insertion of transistors, resistors, capacitors, and other elements known in the electronics industry. The related printed circuit board and other electronic processing elements of an ultimate unit are interconnected to each printed circuit board by means of connector tabs 15 which have a discreet line of demarcation 16 from the circuitry made up by the leads 12 and the component holes 14. The connector tabs 15 are terminated at their lower portion in a busbar tab interconnect 18 at the end portion of which a plating bar tab 19 appears. The busbar tab interconnect 18 and the plating bar tabs 19 are primarily for purposes of processing and plating, and are usually removed prior to the completion of the printed circuit board for its ultimate destined role.

The plater 20 as shown in FIG. 1 has a plurality of hoods 21, each hood having windows 22 for the observation of the printed circuit boards as they pass through the plater. Means in the form of a magazine feed 24 are provided at the right hand portion of the plater shown in FIG. 1.

Figure 21:
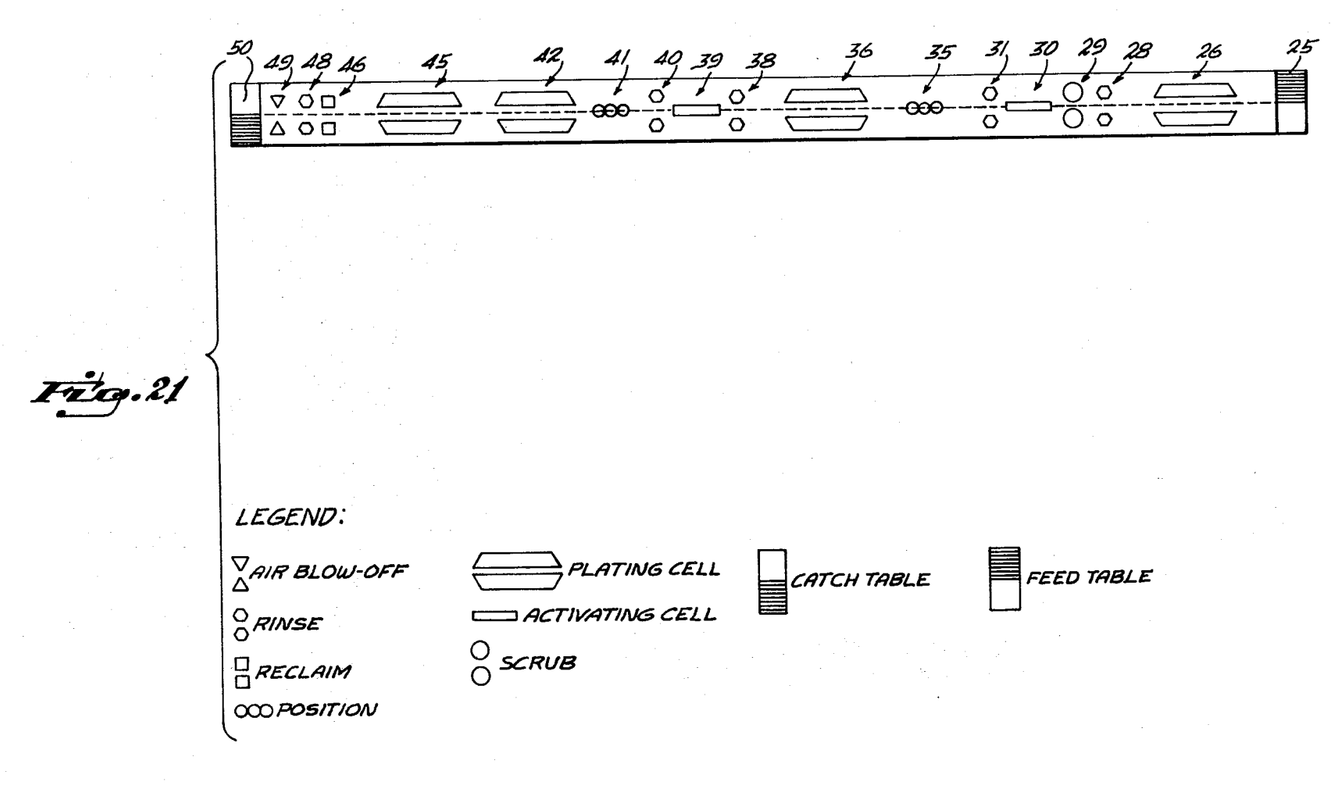
FIG. 21 is a diagrammatic view of the plater containing a legend identifying the various steps at the various locations.

For a better understanding of the total process, reference is made to FIG. 21 where the plater 20 is shown diagrammatically in a plan view. The printed circuit boards 10 are put on to a load station 25 at the right hand portion of the machine. Immediately after passing the load station 25 the printed circuit boards 10 are engaged by a stripper 26 through which the tin lead portion overlying the connector tabs 15 is removed. Thereafter a rinse station 28 is encountered, followed by a scrub station 29, and then an activating station 30 followed by further rinsing at rinse station 31. Thereafter, the stripping of the tin lead has been completed. After each major electrodeposition of etching has been completed, the positioning assembly 35 is encountered in order to precisely position the printed circuit board 10 for its entry into the next plating cell to the end that the line of demarcation 16 on the printed circuit board will be precisely positioned. As noted again in FIG. 21, the positioning station 35 does reposition the printed circuit board for its entry into the plating cell 36 where nickel plating takes place. Upon leaving the nickel plating cell 36, the product is then rinsed at rinse station 38 prior to activating at activating station 39, subsequently rinsing at rinsing station 40, and then being repositioned at positioning station 41 for the gold plating step.

Continuing the flow from right to left, the printed circuit board enters the gold strike station 42, followed by the gold plating station 45. Thereafter, reclaim station 46 is encountered which reclaims any excess gold solution cohearing to the printed circuit board, and subsequently the final rinse station 48 rinses off the printed circuit board 10 for drying at dry station 49. Thereafter the printed circuit boards 10 are repositioned in magazines on the unload station 50. In the principal commercial embodiment the length of the first segment to the first positioning location is 14.2 feet, the distance to the second positioning station 11.2 feet, and the distance to the final catch table 12.2 feet, or a total of 37.6 feet. The unit is approximately 5.5 feet high. Positioning knobs are provided on the front and the ends of the unit to carefully adjust the position of the printed circuit board.

Figures 22, 23:
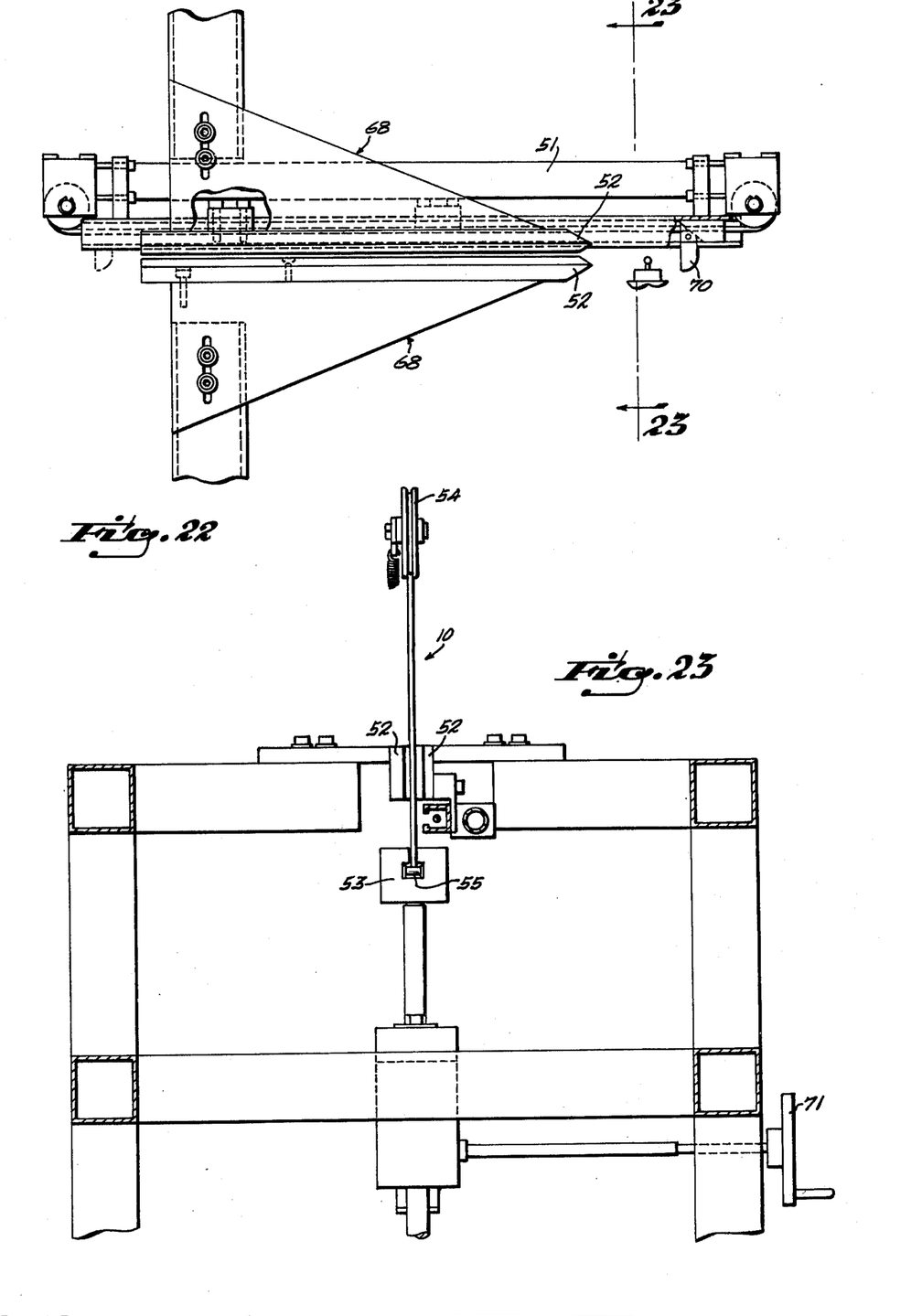
FIG. 22 is illustrative of the position portion of the machine shown in FIG. 21 above.
FIG. 23 is a transverse sectional view of the positioning assembly taken along section line 23—23 of FIG. 22 in essentially the same scale.

The positioning stations are important to the operation of the entire process since they control the exact position of the line of demarcation 16. More specifically with regard to the positioning mechanism, the printed circuit boards 10 are positioned in a magazine 25 which has a plurality of vertical slots 27. It is then presented to the entrance portion of the plater 20 in which an air cylinder 51 presents each printed circuit board to the first strip station 26. The magazine is indexed to move across the plater entrance so that each time the air cylinder 51 is actuated, a printed circuit board 10 is presented to the first pair of vertical guides. As shown in FIG. 22, the vertical guides 52 are in spaced parallel relationship and spaced sufficiently to receive loosely a printed circuit board therebetween. A roller guide 54, as shown in FIG. 23, engages the upper portion of the printed circuit board 10, the lower portion of which rolls on top of a roller chain 55 which is recessed in a guide blank 53. The positioning mechanism 35 is elevated or lowered by handwheel 71, which in turn elevates or lowers the upper face of the roller chain 55 thereby adjusting with precision the position of the printed circuit board when it is engaged by the opposed masking belts 60. As shown in FIG. 24, additional alignment for the masking belts 60 is provided at the point where they enter the sprockets 61, and comprise a pair of opposed rollers 62 which are in rolling contact with the masking belts 60. It is important that the masking belts 60 in their opposed relationship define a line of demarcation 16 on either side of the printed circuit board 10 which is directly opposite the other. Otherwise, when plating one side of the boards will be plated higher or lower than the other. The belt alignment mechanism is totally independent of the positioning mechanism, and as a consequence both adjustments are required.

The masking belts 60, as observed, are primarily timing belts, and operate over a timing sprocket 61 which guide them. In the plating application, the masking belts have a milled out central portion 64 in order to reduce friction. As the masking belts 60 enter the guide 56, the toothed portion rides against a teflon strip 65. The teflon strips are on both of the opposed guides 56, but behind one there is a recess which contains an air bladder 66. The single air bladder 66 is actuated to provide adequate opposed pressure between the masking belts 60 in order to define the line of demarcation 16 in a sealed relationship, and yet hold friction to the minimum consistent with the masking operation. The second positioning station 35 is entered just before nickel plating. There it will be seen that the positioning station comprises an opposed pair of guides 68 which will vertically align the printed circuit board, with the lower edge portion of the printed circuit board on the roller chain 55. A spring loaded dog 70 which is pneumatically actuated receives its intelligence from the lead end of the printed circuit board, at which time it retracts. After the printed circuit board passes the dog, which is spring loaded against the board, the dog extends, and the printed circuit board actuates a limit switch which in turn has the dog engage its rear portion to move the printed circuit board forwardly as it is guided at its upper portion by means of the idler roller and then it is presented to the next set of opposed masking belts 60. At each of the positioning stations 35, the board is transferred in the fashion just defined. In addition, at each such station, the roller chain support guide 54 can be raised or lowered by means of the adjustment wheels 71 shown in FIG. 1 and 23. Between or leading to positioning status 35 from other processing stations roller chain inclines raise or lower the printed circuit board 10 for presentation to the positioning station 35.

Figure 2:
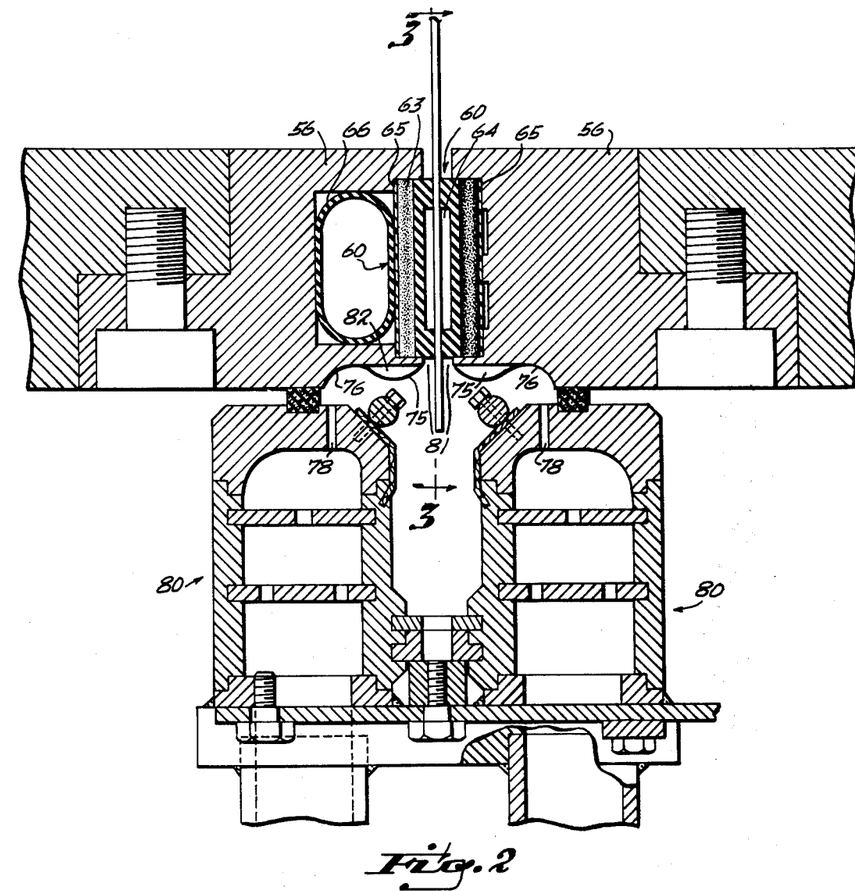
FIG. 2 is a transverse sectional view taken through the center portion of a plating unit illustrating the belt mask and its relationship to the reduced pressure areas.
Figure 3:
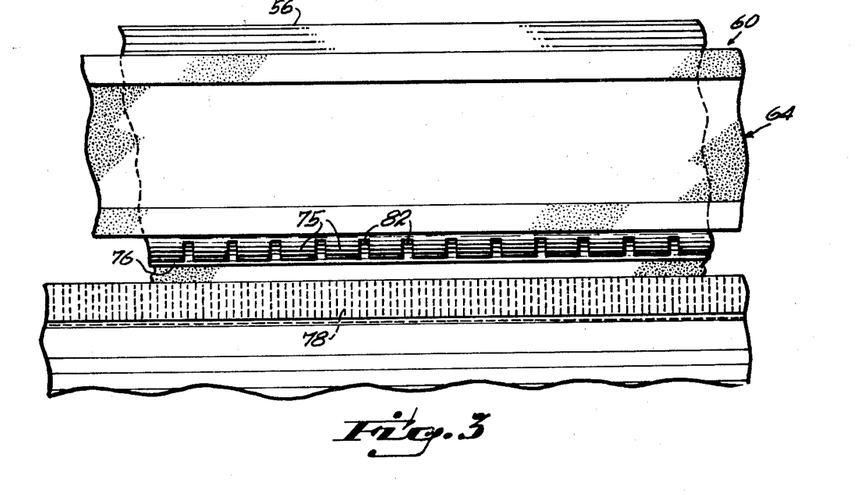
FIG. 3 is a transverse sectional view taken of FIG. 2 along section line 3—3 of FIG. 2.

The guides 56, as shown in FIG. 2, have a curved portion defining a foil 75, and the lead portion 76 of which is immediately above the sparger discharge holes 78, which are approximately 1/32 inch in diameter, and on quarter inch spacing. The sparger assembly 80 is designed so that as the fluid is pumped from the main reservoir, it is progressively restricted in its flow, and consequently the flow rate and pressure is steadily increased to prevent cavitation, aeration, and other interruptions in its fluid consistency. As the fluid leaves the sparger discharge 80, it is directed upwardly and then curved downwardly by the curved foil 75. This results in a venturi effect at the area where the curve reverses, referred to herein as venturi area 81. In some applications, it will be required to get more plating fluid at the line of demarcation 16. In such instances, the slots 82 are in the curved foil portion 75, and may be anywhere from twenty to two hundred thousandths inch thick, and on spacings of anywhere from one quarter to an inch. In some applications where the plating is to be minimized at the line of demarcation, the slots 82 are not used. In a typical commercial application, the curvilinear portion of the foil is on a 9/16 inch radius. This radius is increased or decreased depending upon the concentration of fluid desired at the line of demarcation.

The discharge of the sparger assembly 80 comprises upper fixed bored plate 88 and lower shiftable bored 89. The lower bore plate 89 is shiftable along the longitudinal axis beneath the printed circuit board. In this fashion the amount of negative pressure in the plating chamber above the upper bore plate 88 can be controlled by throttling the flow rate. In some instances, where the flow rate is high, the negative pressure generated at the gap on the ends of the printed circuit boards causes air to flow into the plating area, and may contaminate the same, or introduce air bubbles in the recirculation electrodeposition fluid. This negative pressure can be reduced, or virtually stabilized to atmospheric by shifting the lower bore plate 89, and by regulating the diameter of the bore or pass through in the upper bore plate 88. The adjustment is made to balance the limits of aeration of the fluid and leaking at the ends of the printed circuit boards.

The unload station 50 is comparable to the loading station in that a magazine 25 having a plurality of parallel vertical slots 27 is filled by the printed circuit boards, and the same are delivered with a transfer mechanism off of a roller chain on a guide, in the same fashion as the positioning stations 35. This is desirable since it is important to make sure that the printed circuit board is slightly above the slot 27 when it enters the magazine 25. When the magazine is filled, the printed circuit boards are removed and stacked. At this point they have been not only fully processed, but rinsed and run through a drying station 49 and are ready for further processing in an electronic component.

While the masking belts 60 have been shown and described as timing belts having a plurality of teeth 63, it will be appreciated that a flat belt properly tensioned against a drive wheel will perform in many applications. Also, while the masking face of the masking belts have been shown as having a milled center 64, it will be appreciated that in applications where friction is not a basic problem, the extra cost will not be necessary. The process has been shown with a plurality of stations including washing, rinsing, scrubbing and the like. It will be appreciated that in varying applications, these stations may be eliminated, or additional stations added. The principal aspect of the present invention is directed to the stripping and plating activities, and specifically the plating portion with masking, which can be controlled to precise and repeatable tolerances.

Figure 5:
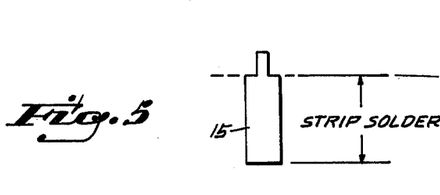
Figure 6:
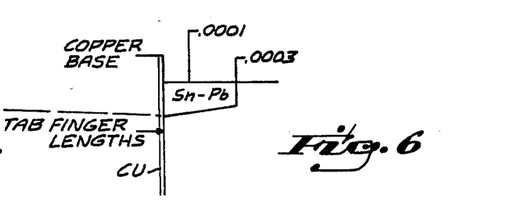
Figure 7:
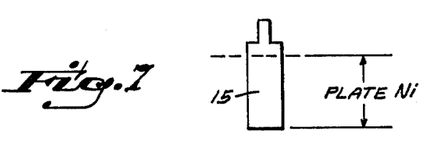
Figure 8:
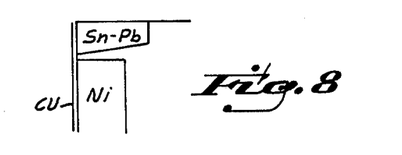

The tabs 15 are shown, as set forth above, in FIGS. 5 through 20 inclusive. After the tin lead is stripped from the tab, as shown in FIG. 5, its cross-sectional appearance is substantially the same as FIG. 6. In FIG. 6 it will be seen that nothing but copper (indicated by legend CU) exists on top of the printed circuit board below the line of demarcation. On the other hand, for purposes of developing the junction, the tin lead portion is between 0.001 and 0.003 inches thick as shown diagrammatically in FIG. 6 with the legend SN-PB. Thereafter, as shown in FIGS. 7 and 8, the nickel (indicated by legend Ni) is plated onto the tab connector, but in precise spaced-relationship to the residual portion of tin lead. In order to obtain this space, the level of the line of demarcation during the nickel plating process is a small distance lower than it was during the initial stripping action which resulted in the product as shown diagrammatically in FIGS. 5 and 6.

Figure 9:
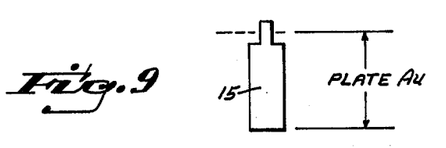
Figure 10:
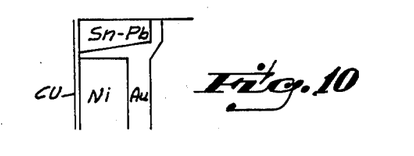
Figure 11:
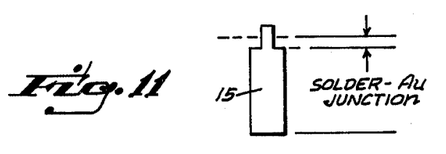
Figure 12:
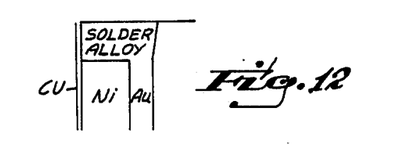
Figure 13:
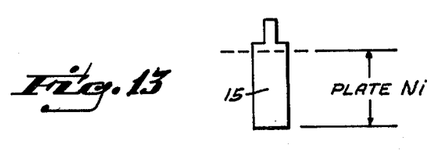
Figure 14:
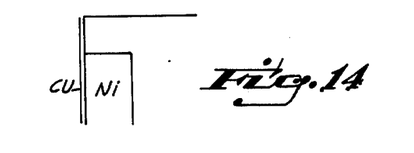
Figure 15:
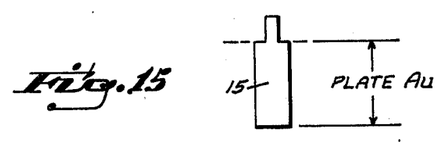
Figure 16:
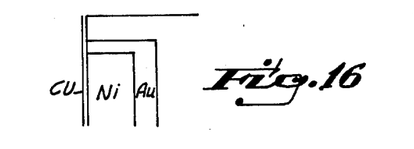
Figure 17:
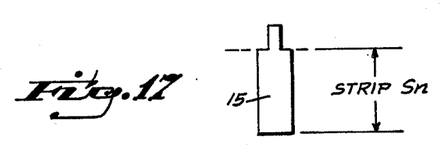
Figure 18:
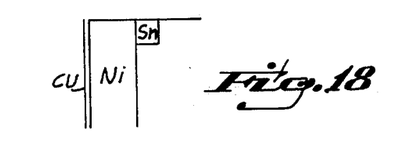
Figure 19:
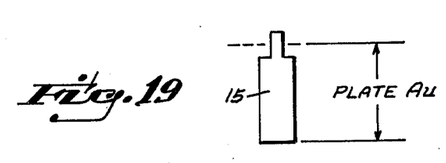
Figure 20:
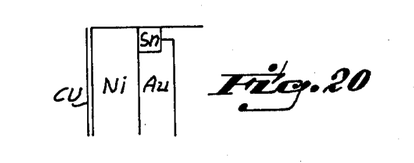

Thereafter the gold (indicated by the legend AU) is plated as shown in FIGS. 9 and 10, with a line of demarcation above the line of demarcation which was undertaken in stripping, and thereby the gold takes a wrap-around relationship to the tin lead specifically as shown in FIG. 10. Thereafter when reflow takes place, as shown in FIGS. 11 and 12, the tin and lead flow together and become a solder alloy, and the gold diffuses into the solder alloy. This creates a functional junction between the gold and tin lead (solder) which heretofore has been unobtainable because tolerances of the plus or minus 0.005 inches of the present machine had been unavailable. As shown in FIG. 8, typically the gap between the nickel and the tin lead strip is 0.020–0.030 inches. The overplating of the gold above the tin lead atom as shown in FIG. 8 is normally set for 0.020–0.030 inches as well. The thickness, however, is limited to ten millionths, since any greater thickness of gold than ten millionths of an inch will not diffuse acceptably into the normal 0.0002–0.0005 inch thick tin lead during reflow. The plating cell of the subject machine is readily adjusted to provide a decreased gold thickness at the gold overplate, and also provide a rapid increase or step in thickness as the distance from the demarcation line is increased. The increased thickness on the contact portion of the connector tab is essential for wear characteristics.

Other types of printed circuit boards have been developed in the industry as well. When a printed circuit board is manufactured with a copper surface the nickel gold plating from the subject machine appears as shown in FIGS. 13 through 16. In the instance as shown, the gold is plated over the nickel to provide a gold-copper junction. Still other processes use a tin surface such as an etch resist with a copper or nickel or preplate cycle. The resulting strip-gold plate cycle from the present machine is shown in FIGS. 17–20.

When step plating is not needed, or is considered undesirable, a simple tooling change permits this to be done with the same machine. The step plating is a direct result of solution control (reduced aggitation) and anode shielding. Since the solution aggitation at the datum in the present machine is the result of the flow geometry in the belt guide, the milled slots, and the reverse direction, by reducing the number of slots the result will be a flow reduction at the datum by the mask interfare. Reducing the number of slots also closes the window to the anode, again reducing current density and subsequent plating thickness. As a consequence, the overlay as shown in FIG. 10 can be closely controlled by the number of slots, and the flow of solution.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

What is claimed is:

1. In the method of plating printed circuit board connector tabs of the type characterized by the sequential stripping of tin lead, rinsing, and plating with nickel, and gold, or other metals atop the underlying copper base of the connector tab, the improved steps of:
   providing an opposed and abutting pair of endless moving belts of non-absorbtive material,
   providing mechanical means for adjustably pressing said endless belts each against the other,
   compressively engaging a series of printed circuit boards between said belts thereby providing a line of demarcation, lying on said boards adjacent to and above the connector tabs, in registration with the lower edge of said abutting endless belts,
   maintaining the compressive relationship of the belts to the printed circuit boards while transporting the unmasked area of the board below said line of demarcation through a plating cell,
   providing a turbulent flow of electrodeposition fluid by reversing the flow of the fluid exiting a flow system adjacent the unmasked contact tabs,
   whereby the provision of a reverse flow creates an area of turbulence extending to the line of demarcation.

2. In the method of claim 1 above,
   providing a positive pressure sparger to direct the electrodeposition fluid against reverse flow portion,
   providing means for draining the fluid from the area where plating takes place, and,
   providing means for throttling the drain, whereby the amount of negative pressure created within the system can be controlled by throttling the discharge of the electrodeposition fluid.

3. In the method of claim 1 wherein:
   positioning of a concave-convex foil is provided above a vertical stream of electrodeposition fluid to create a reversal of flow and turbulence.

4. In the method of claim 3,
   providing spaced slots in the foil proportionate to increase the electrodeposition fluid flow desired immediately adjacent the line of demarcation proportionate to increased flow of electrodeposition fluid desired immediately beneath said line of demarcation.

5. A device for plating the connector tab portions of a printed circuit board comprising, in combination,
   means for longitudinally feeding a printed circuit board along a datum line,
   opposed resilient members for engaging the printed circuit board at a line of demarcation defining the upper portion of the connector tabs of such printed circuit board,
   said belts being held in compressive engagement with said printed circuit board,
   a sparger system developed to flood the connector tabs,
   said sparger system having nozzle portions directed upwardly,
   a curvilinear recess venturi guide positioned above said nozzles proportioned to receive fluid directed therefrom and recirculated downwardly,
   said curvilinear portion being concave above the nozzles and reversely convex a position between the upward projection of the nozzles and the line of demarcation, whereby a venturi effect is created and a reduced pressure area exists at the termination of the venturi section immediately adjacent the line of demarcation.

6. In the device for plating of claim 5,
   one of said guides being backed by an inflatable air bladder to adjust the compression between the opposed belts.

7. In the device for plating of claim 5,
   strips of minimized friction material behind the opposed portions of the belt to thereby reduce friction as the belt passes along said means for longitudinally feeding a printed circuit board.

8. In the apparatus of claim 5,
   pump means for driving the electrodeposition fluid into the sparger system,
   drain means for draining the fluid after passing the same over the printed circuit board tabs,
   throttling means for controlling the amount of discharge, whereby the negative pressure within the chamber can be controlled by throttling the discharge.

9. In the device for plating of claim 5,
means for raising and lowering one of said belts to thereby insure direct opposed alignment.

10. In the device for plating of claim 9,
said means for adjusting said belt comprising a pair of opposed rollers spaced to straddle one of said belts on the top and the bottom, and
means for raising or lowering said rollers to thereby raise or lower the one of said belts being used for adjustment.

11. In the device for plating connector tab portions of claim 5,
means defining slots in said curvilinear recess proportioned to increasing flow of electrodeposition fluid to be passed beneath said line of demarcation.

12. A printed circuit board processor comprising, in combination,
a positioning mechanism for receiving said printed circuit board atop a fixed guide surface,
a guide member yieldably engaging the upper portion of said printed circuit board,
means for advancing said printed circuit board,
a pair of opposed belts for engaging said printed circuit board and masking the same to travel through a processing station,
means for adjustably guiding said belts in their opposed relationship,
means for moving said positioning mechanism vertically to adjust the line of demarcation on the printed circuit board,
transfer means for engaging said printed circuit board and delivering the same to an additional station,
further guide means for presentation of the printed circuit board to plating stations,
and positioning means at the final station in said plater for discharging said processed printed circuit boards.

13. In the printed circuit board plater of claim 12,
a drive system for actuating all of the plating belts and transfer belts in a synchronized manner,
said drive system moving the belts in the plating stations in a pulling configuration, and driving said transfer stations in a pushing relationship.

14. In the printed circuit board processor of claim 12,
said fixed guide surface comprising a plurality of rollers.

15. In the printed circuit board processor of claim 12,
transfer means comprising a plurality of rollers at the lower edge thereof and located upwardly or downwardly in accordance with the desired position at the next plating station.

16. In the printed circuit board processor of claim 12,
opposed rollers adjustably engaging one of said belts to raise or lower the same for exact registry with the opposed belt.

* * * * *